US010560108B2

(12) United States Patent
Satoh

(10) Patent No.: US 10,560,108 B2
(45) Date of Patent: Feb. 11, 2020

(54) APPARATUSES AND METHODS FOR DETECTING A LOOP COUNT IN A DELAY-LOCKED LOOP

(71) Applicant: MICRON TECHNOLOGY, INC., Boise, ID (US)

(72) Inventor: Yasuo Satoh, Ibaraki (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/440,818

(22) Filed: Jun. 13, 2019

(65) Prior Publication Data

US 2019/0296752 A1 Sep. 26, 2019

Related U.S. Application Data

(62) Division of application No. 15/697,773, filed on Sep. 7, 2017, now Pat. No. 10,333,532.

(51) Int. Cl.
*H03L 7/081* (2006.01)
*H03L 7/099* (2006.01)
*H03L 7/10* (2006.01)
*H03L 7/089* (2006.01)

(52) U.S. Cl.
CPC .......... *H03L 7/0992* (2013.01); *H03L 7/089* (2013.01); *H03L 7/0814* (2013.01); *H03L 7/10* (2013.01)

(58) Field of Classification Search
USPC ................................. 327/147–149, 156–158
See application file for complete search history.

(56) References Cited

U.S. PATENT DOCUMENTS

| 3,665,169 | A | * | 5/1972 | Henderson | ........... G01G 23/163 |
| | | | | | 702/87 |
| 4,414,504 | A | * | 11/1983 | Kennedy | ................. G01S 11/10 |
| | | | | | 324/76.39 |
| 4,471,299 | A | * | 9/1984 | Elmis | .................... G01R 25/08 |
| | | | | | 324/76.41 |
| 5,019,786 | A | * | 5/1991 | Fairley | ................... G01R 25/00 |
| | | | | | 324/76.41 |

(Continued)

FOREIGN PATENT DOCUMENTS

EP  2884366 A1  6/2015
WO  2019050867 A1  3/2019

OTHER PUBLICATIONS

International Search Report and Written Opinion dated Feb. 1, 2019 for PCT application No. PCT/US2018/049413, 12 pages.

(Continued)

*Primary Examiner* — Adam D Houston
(74) *Attorney, Agent, or Firm* — Dorsey & Whitney LLP

(57) ABSTRACT

Apparatuses and methods are disclosed for detecting a loop count in a delay-locked loop that uses a divide clock in a measure initialization process. An example apparatus includes a divider configured to receive a signal and produce a first divided signal and a second divided signal that is complementary to the first divided signal, a first circuit configured to count the first divided signal during a first enabled period and produce a first count value, a second circuit configured to count the second divided signal during a second enabled period and produce a second count value, and an adder configured to produce a third count value responsive to the first and second count values.

20 Claims, 9 Drawing Sheets

(56) References Cited

U.S. PATENT DOCUMENTS

| | | | | |
|---|---|---|---|---|
| 5,107,522 A * | 4/1992 | Kitayama | | H03J 7/065 375/344 |
| 5,442,278 A * | 8/1995 | Fan Chiang | | G01R 23/10 324/76.41 |
| 5,574,757 A * | 11/1996 | Ogawa | | H03L 7/145 327/156 |
| 5,844,622 A * | 12/1998 | Hulvey | | H03L 7/0992 348/546 |
| 6,560,302 B1 * | 5/2003 | Shim | | G11B 20/1403 375/354 |
| 7,496,781 B2 * | 2/2009 | Tamura | | G11C 7/1072 327/156 |
| 7,716,510 B2 | 5/2010 | Kwak | | |
| 7,728,639 B2 | 6/2010 | Gomm et al. | | |
| 8,227,941 B2 * | 7/2012 | Patterson | | H02P 9/302 307/140 |
| 10,333,532 B2 * | 6/2019 | Satoh | | H03L 7/0992 |
| 2001/0036239 A1 * | 11/2001 | Oka | | H03C 3/0925 375/376 |
| 2004/0183590 A1 | 9/2004 | Huang et al. | | |
| 2005/0138457 A1 | 6/2005 | Gomm et al. | | |
| 2008/0189568 A1 * | 8/2008 | Kwak | | G11C 7/1072 713/501 |
| 2008/0292044 A1 | 11/2008 | Saito et al. | | |
| 2009/0307518 A1 | 12/2009 | Hsieh | | |
| 2010/0199117 A1 | 8/2010 | Kwak | | |
| 2012/0249193 A1 | 10/2012 | Willey et al. | | |
| 2014/0269120 A1 * | 9/2014 | Na | | G11C 7/222 365/193 |
| 2015/0263739 A1 * | 9/2015 | Jung | | G11C 7/1057 327/149 |
| 2016/0164665 A1 * | 6/2016 | Taylor | | H03L 7/06 375/376 |
| 2019/0074841 A1 | 3/2019 | Satoh | | |
| 2019/0296752 A1 * | 9/2019 | Satoh | | H03L 7/10 |

OTHER PUBLICATIONS

PCT Application No. PCT/US18/49413 titled "Apparatuses and Methods for Detecting a Loop Count in a Delay-Locked Loop" filed Sep. 4, 2018.

U.S. Appl. No. 15/697,773 entitled "Apparatuses and Methods Detecting a Loop Count in a Delay-Locked Loop" filed Sep. 7, 2017, pp. all.

* cited by examiner

APPARATUSES AND METHODS FOR DETECTING A LOOP COUNT IN A DELAY-LOCKED LOOP

CROSS REFERENCE TO RELATED APPLICATION(S)

This application is a divisional of pending U.S. patent application Ser. No. 15/697,773 filed Sep. 7, 2017. The aforementioned application is incorporated herein by reference, in its entirety, for any purpose.

BACKGROUND

Many high speed electronic systems operate with critical timing requirements that dictate a need to generate a periodic clock waveform possessing a precise timing relationship with respect to some reference signal. The improved performance of computing integrated circuits and the growing trend to include several computing devices on the same board present a challenge with respect to synchronizing the time frames of all the components.

While the operation of all components in the system should be highly synchronized, i.e., the maximum skew in time between significant edges of the internally generated clocks of all the components should be minimized, it is not enough to feed the external clock of the system to all the components. This is because different chips may have different manufacturing parameters, which, when taken together with additional factors such as ambient temperature, voltage, and processing variations, may lead to large differences in the phases of the respective chip generated clocks.

Synchronization can be achieved by using a timing circuit, such as a digital delay locked loop (DDLL) circuit, to detect the phase difference between clock signals of the same frequency and produce a digital signal related to the phase difference. DDLL circuits may require a relatively large number of clock cycles to synchronize. In conjunction with a DLL circuit, an open-loop topology may be used, such as a measure-controlled delay (MCD) circuit, where a timing measurement directly controls a variable delay. MCD circuits exhibit a fast lock capability (e.g., within 1-4 clock cycles after initialization). The MCD circuit generates an initial measurement, and the DDLL takes over to maintain the lock and track variations over time.

DETAILED DESCRIPTION

The present disclosure is directed to systems and methods for detecting a loop count in a delay-locked loop that uses a divide clock in a measure initialization process. A delayed-locked loop may be a component of a memory and may be used by the memory to synchronize internal clock signals with an externally received clock. In operation, the delay-locked loop may be reset from time to time in order to ensure proper synchronization under different operating conditions, after power-up, and so on. As part of the reset process, the delay-locked loop may execute a measure initialization process, which functions to set an amount of delay of a variable line. The variable delay line may be arranged in the forward path of a memory command. The variable delay may one part of an overall delay that is encountered by the command as it traverses the forward command path. A loop counter may be employed during the measure initialization process to count N, the number of clock cycles it takes a reference clock to traverse a feedback loop associated with the delay-locked loop. In accordance with embodiments that use a divide clock in the timing pathway, the counter may include separate N-detect blocks for each portion of the divided clock.

Figure 1:
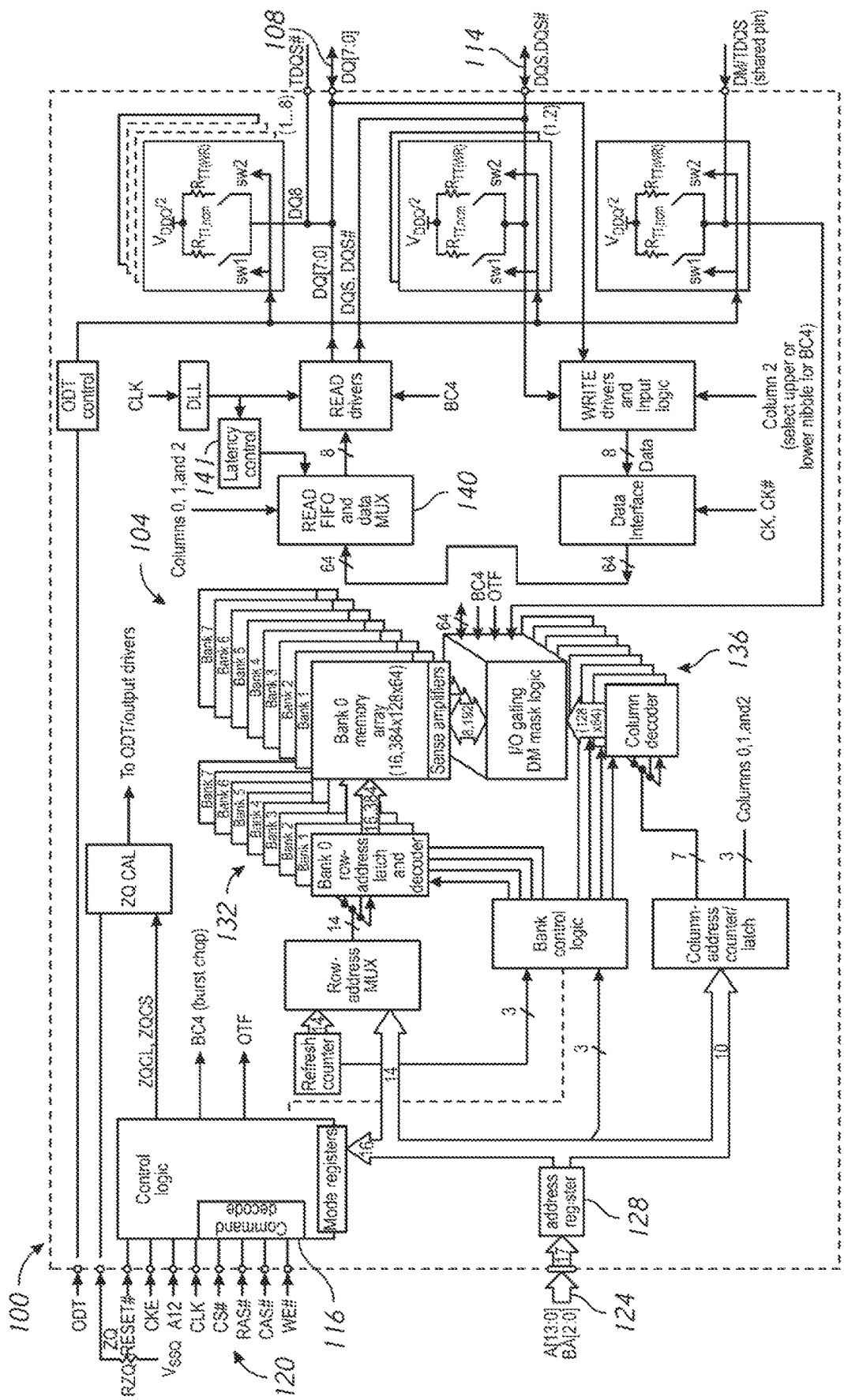
FIG. 1 is a schematic illustration of a portion of a memory according to an embodiment of the disclosure.

FIG. 1 is a schematic illustration of a portion of a memory 100 according to an embodiment of the disclosure. The memory 100 includes an array 104 of memory cells, which may be, for example, DRAM memory cells, SRAM memory cells, flash memory cells, or some other type of memory cells. The memory 100 may be generally configured to operate in cooperation with a larger digital system that includes at least a processor configured to communicate with the memory 100. In the present description, "external" refers to signals and operations outside of the memory 100, and "internal" refers to signals and operations within the memory 100. As an illustrative example, the memory 100 may be coupled to a microprocessor that provides external commands and clock signals to the memory 100. Although examples in the present description are directed to synchronous memory devices, the principles described herein are equally applicable to other types of synchronous integrated circuits.

The memory 100 may be generally configured to execute read and/or write commands received from an external device. Read commands provide data stored in the array 104 to the external device across a data bus 108. Write commands receive data from the external device across the data bus 108 and store the data in the memory array 104. The following discussion generally references read commands by way of example and not limitation. In processing a read command, the memory 100 receives an external clock CLK and generates an internal clock that synchronizes internal signals so as to provide output data on the data bus 108 with appropriate timing. Here, the memory device 100 uses a delay-locked loop 112 to synchronize internal signals including generating a data strobe signal 114. The data strobe signal 114 is provided as output to the external controller and is asserted at a time when the requested read data is available on the data bus 108 for capture by the external controller.

The memory system 100 includes a command decoder 116 that receives memory commands through a command bus 120. The command decoder 116 responds to memory commands applied to the command bus 120 by generating corresponding control signal to perform various operations on the memory array 104. For example, the command decoder 116 may generate, internal control signals to read data from and/or write data to the memory array 104. Row and column address signals associated with a particular command are applied to the memory 100 through an address bus 124. The address bus 124 provides the row and column address signals to an address register 128. The address register 128 then outputs a separate column address and a separate row address to the memory array 104.

As can be seen in FIG. 1, row and column addresses may be provided by the address register 128 to a row address decoder 132 and a column address decoder 136, respectively. The column address decoder 128 selects bit lines extending through the array 104 corresponding to respective column addresses. The row address decoder 132 includes or is coupled to a word line driver or similar component that activates respective rows of memory cells in the array 104 corresponding to received row addresses. The selected data line (e.g., a bit line or bit lines) corresponding to a received column, address are coupled to a read/write circuitry 140 to provide read data to a data output buffer or similar component via an input-output data bus 108. The read/write circuitry 140 may receive a latency control signal from a latency control 141. Write data is applied to the memory array 104 through a data input buffer or similar component and the memory array read/write circuitry 140.

The timing of signals external to the memory 100 may be determined by the external clock CLK. Operations within the memory 100 are typically synchronized to external operations. The delay-locked loop 112 is generally configured to receive the external clock CLK and generate a synchronized internal clock signal. The synchronized internal clock signal generated by the delay-locked loop 112 may be provided to various internal memory components in order to facilitate the latching of command, address, and data signals in accordance with the external clock CLK. For example, data output may be placed on the data bus 104 of the memory 100 in synchronism with the external clock CLK so that the memory device 100 outputs data in a manner that allows the data to be captured by the external controller. To output data with proper timing, the delay-locked loop 112 develops an internal clock signal in response to the external clock signal and applies the internal clock signal to latches contained in the memory device 100 to clock data. The general connection of the delay-locked loop 112 to other component of the memory 100 will now be described in greater detail with reference to FIG. 2.

Figure 2:
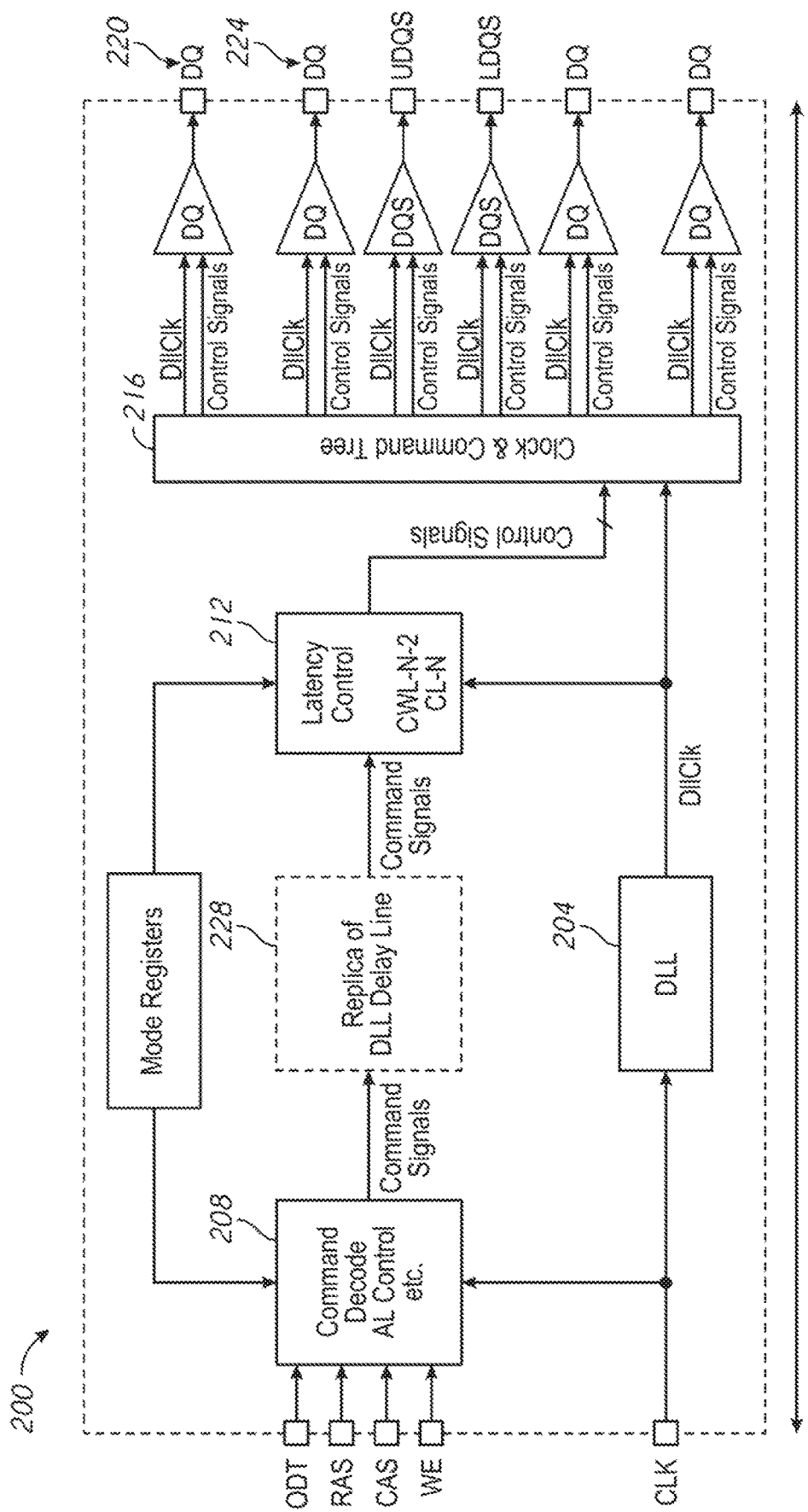
FIG. 2 is a schematic illustration of a synchronization path according to an embodiment of the disclosure for the memory shown in FIG. 1.

FIG. 2 is a block diagram that illustrates a synchronization path for various signals within a memory 200 in accordance with the present disclosure. The memory 200 may correspond to the memory 100 of FIG. 1. Certain components illustrated in FIG. 1 are omitted from FIG. 2 in order to simplify the drawing. FIG. 2 illustrates a path of various signals that propagate from memory 200 input to output in the course of the memory 200 executing a write or read operation. FIG. 2 includes a delay-locked loop 204, which may correspond to the delay-locked loop 112 of FIG. 1. The delay-locked loop 204 is generally configured to provide clock synchronization within the memory 100. As used herein, the term synchronized includes signals that are coincident and signals that have a desired delay relative to one another.

As described in connection with FIG. 1, the memory 200 receives a CLK signal from an external source, such as a computing device coupled to the memory device 200. Initially, the external CLK may be received as input at both the delay-locked loop 204 and a command decoder 208. The command decoder 208 is generally configured to receive an external command, decode the command, and to output separate internal control signals to perform various operations, for example, read operations, write operations, etc. The command decoder 208 may correspond to the command decoder 116 of FIG. 1. The outputs drive a memory array (shown in FIG. 1) so as to provide read data to a latency control 212. The latency control 212 of FIG. 2 may correspond to the latency control 141 in FIG. 1 and, may be constructed by a shift register and other components of FIG. 1. Once the read data is received at the latency control 212, the latency control 212 may provide the data out the data bus 220 that provides an interface between the memory 200 and the external controller. This path out to the data bus 220 is generally referred to as the clock and command tree 216 in FIG. 2. When the requested read data is present on the data bus 220, the memory 200 may assert the data strobe line 224 to indicate to the external controller that data is available for capture.

FIG. 2 additionally shows a delay component 228 that is generally arranged proximate to the output of the command decoder 208. The delay component 228 is coupled to the delay-locked loop 204 and is generally configured to provide a replica of the delay that is present in the delay-locked loop 204. As a part of providing clock synchronization within the memory 200, the delay-locked loop 204 adjusts the amount of delay that is provided by the delay component 228. Here, the delay-locked loop 204 controls the amount of delay that is generated by the delay component 228 so as to delay the read command by an amount that causes the read command timing to synchronize with an internal clock that is output from the delay-locked loop 204.

The output clock provided by the delay-locked loop is generally identified in FIG. 2 as DIIClk. The delay-locked loop 204 is generally configured generate the DIIClk signal based the external clock CLK that it receives as input. As shown in FIG. 2, DIIclk is coupled to the latency control 212 and to a clock and command tree 216. By controlling the amount of delay that is present in the DIIClk signal, the delay-locked loop 204 provides an approximate delay that closely matches the phase difference between input (CLK) and output (DIIclk) clock signals. The delay-locked loop 204 introduces a corresponding amount of delay into the command path via control of the delay component 228. In this way, commands are synchronized with the DIIClk clock when the command arrive at components such as the latency control 212 and the clock and command tree 216, which are in the DIIClk domain. The operation of a delay-locked loop will now be described in greater detail with reference to FIG. 3.

Figure 3:
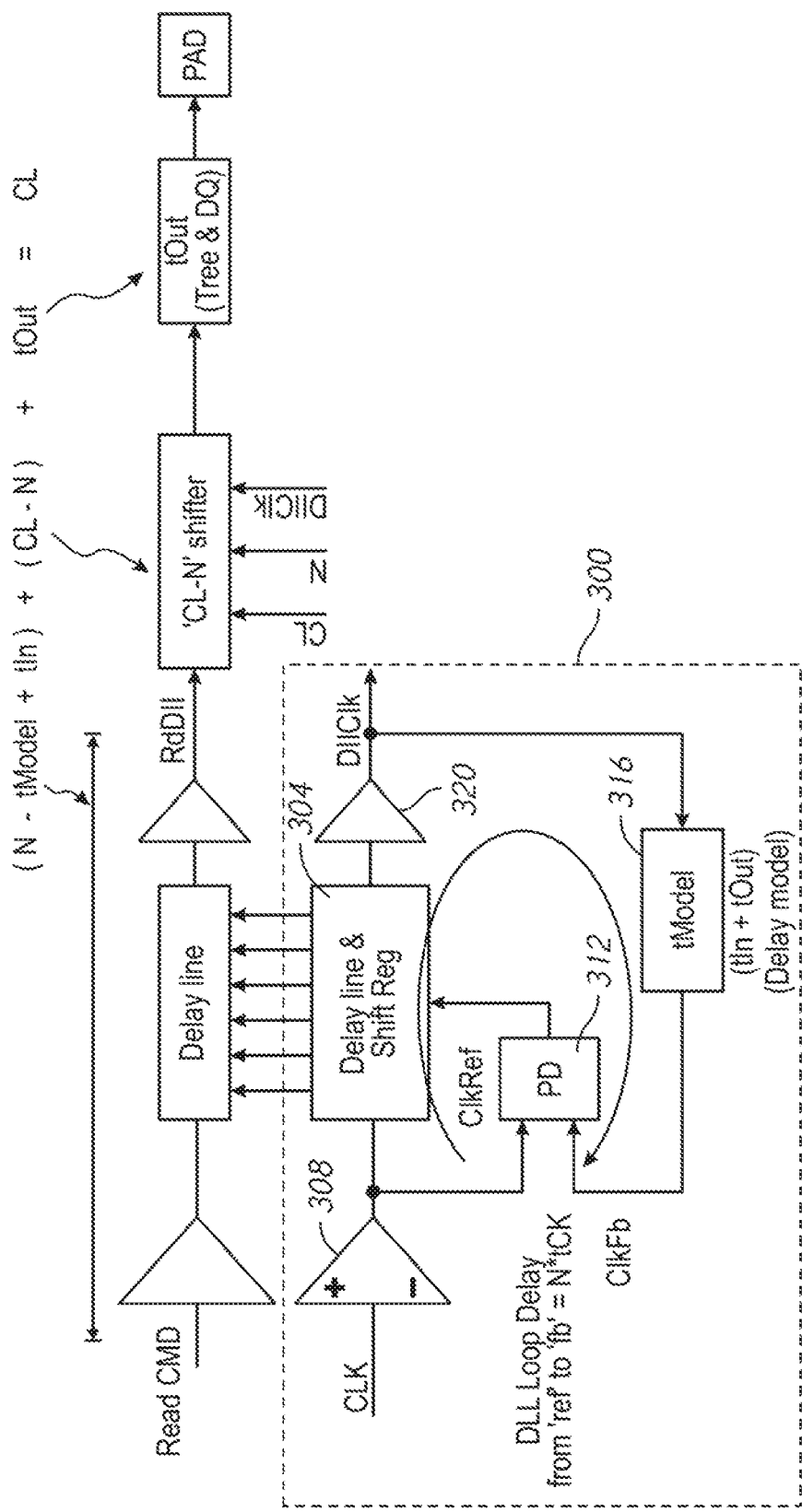
FIG. 3 is a schematic illustration of a delay-locked loop for the memory device of FIG. 1 according to an embodiment of the disclosure.

FIG. 3 is a schematic illustration of a delay-locked loop 300 for providing an approximate delay that closely matches the phase difference between input and output clock signals. The delay-locked loop 300 may correspond to the delay-locked loop 112 of the FIG. 1 and/or the delay-locked loop 204 of FIG. 2. The delay-locked loop 300 uses a feedback configuration that operates to feed back a phase difference-related signal to control one or more delay lines, such as a variable delay line 304, for advancing or delaying the timing of one clock signal to "lock" to a second clock signal.

An external clock CLK is initially applied to the circuit 300 and received by an input buffer 304 that provides a buffered clock signal ClkRef to the delay-locked loop circuit 300. The ClkRef signal is delayed relative to the external clock CLK due to a propagation delay of the input buffer 30. The ClkRef signal is then applied to variable delay line 304 that includes a number of delay stages. The variable delay line 304 may include a shift register or similar component that selects delay stages so as to apply a measured delay for adjusting the phase of the ClkRef signal. The shift register or other component controls adjustments to the variable delay line 304 by providing shift control signals in response to receiving control signals from a phase detector 312.

In response to the shift control signals, the variable delay line 304 applies a measured delay to adjust the phase of the ClkRef signal near the desired phase for achieving the phase lock condition. The variable delay line 304 generates an output signal DIIClk. The DIIClk signal is provided to a model delay circuit 316 that duplicates inherent delays added to the applied external clock signal as it propagates through the delay loop, such as the input buffer 304 plus output path delay 320 that may occur after the delay-locked loop 300.

The model delay circuit 316 then provides a feedback signal ClkFb to the phase detector 312. The phase detector 312 compares the phases of the ClkRef signal and the ClkFb signal to generate shift selection signals to the shift register to control the variable delay line 304. The shift selection signal instructs the shift register to increase the delay of the variable delay line 304 when the ClkFb signal leads the ClkRef signal, or decrease the delay in the opposite case. The delay may be increased or decreased by adding or subtracting a number of stages used in the variable delay line 304, where the variable delay line 304 includes number of delay stages. In this manner, the delay-locked loop 300 may synchronize an internal clock signal DIIClk with an external clock CLK.

The measured delay that is applied to adjust the phase of the ClkRef signal is typically determined through a "measure initialization" process that is executed by a memory from time to time in order to ensure proper synchronize under different operating conditions, after power-up, and so on. As was described above, the DLL 300 may take a certain amount of time to achieve a "locked" condition. This time may be shortened if the variable delay line 304 was initially set to a delay which approximates the anticipated needed delay to synchronize the internal and external clock signals. Minimal delay may be preferable for locking purposes due to lower power being consumed. In order to provide this initial delay, some DLL circuits may include a measurement initialization capability. The process of measure initialization will now be described in greater detail with reference to FIG. 4.

Figure 4:
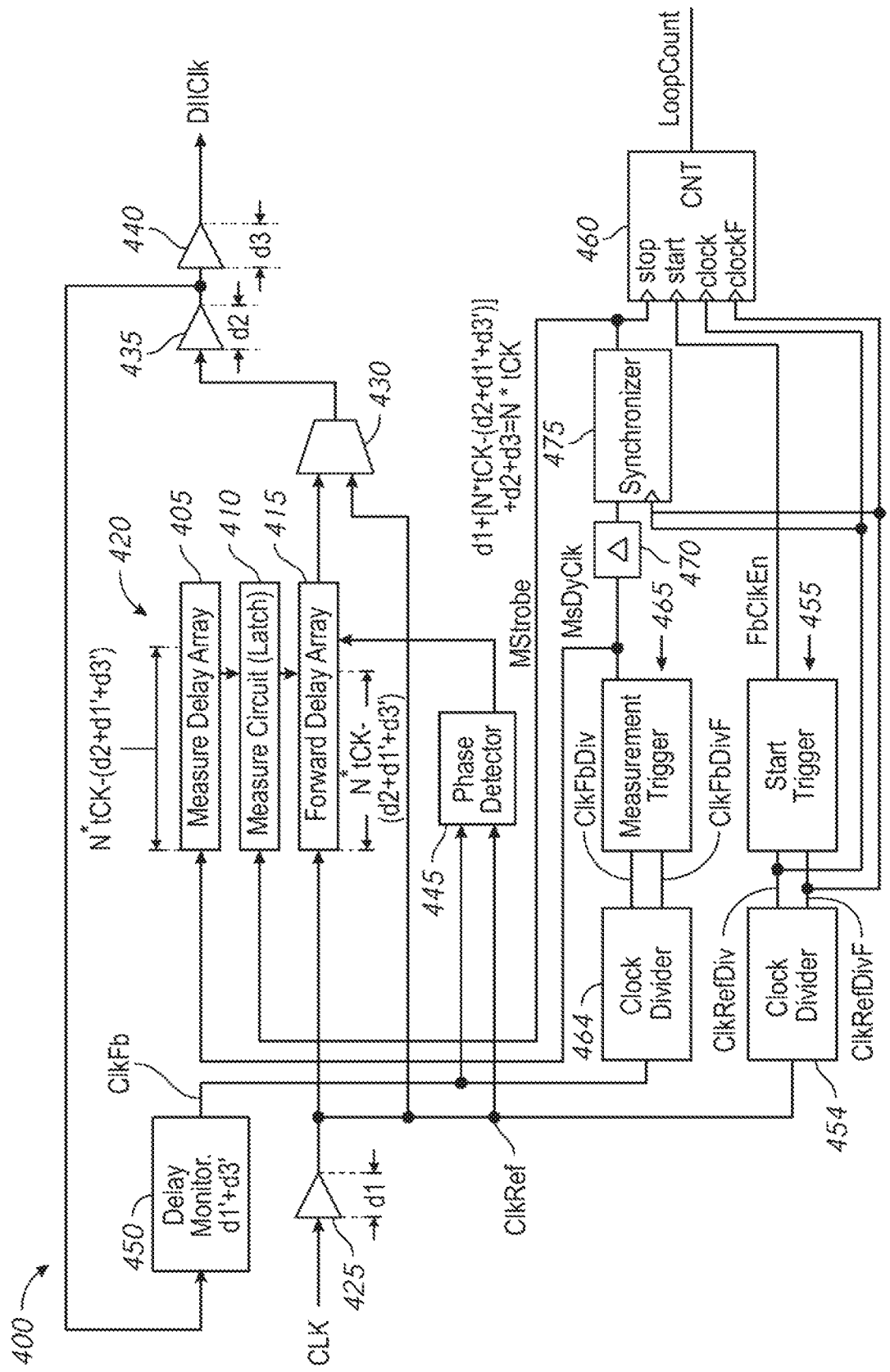
FIG. 4 is a schematic illustration of a delay-locked loop according to an embodiment of the disclosure.

FIG. 4 is a simplified block diagram of a delay-locked loop 400 in accordance with the present disclosure is illustrated. FIG. 4 includes a measure controlled delay circuit 420 and a loop counter 460. The measure controlled delay circuit 420 is generally configured to determine an appropriate variable delay amount to be applied in a given circumstance to ensure appropriate synchronization of signals in a memory. The measure controlled circuit 420 operates during a "measure initialization" process that servers to configure the delay-locked loop 400. Thus, measure initialization typically takes place before the memory of which the delay-locked loop 400 is part begins executing read or write commands.

The loop counter 460 also executes during this initial configuration process to detect N, which herein refers to the number of clock cycles that occur during the measure initialization process. More specifically, N refers to the number of clock cycles it take for a reference clock to traverse the feedback loop that makes up the delay-locked loop 400. The memory uses the value of N in a number way following its measurement by the loop counter 460 during the measurement process. In one respect, the memory uses N to make further timing adjustment to ensure that the memory meets specified latency requirements. These further timing adjustments may take the form of adjusting timing amounts through shifters or the like that are associated with components that are downstream from the delay-locked loop 400. In another respect, the value of N as detected by the loop counter 460 may be provided to the phase detector of the delay-locked loop to ensure that subsequent timing adjustments made within the delay-locked loop 400 occur at an effective rate.

In the following discussion, both the measure controlled delay circuit 420 and the loop counter 460 are addressed. The measure controlled delay circuit 420 is discussed first. Following this, the loop counter 460 is discussed. Although present embodiments are described with reference to a measure controlled delay circuit to establish the synchronization between the input and output clock signals, the scope of these embodiments is not so limited. Other types of synchronization circuits, including a synchronous mirror delay circuit and a phase locked loop circuit may be used.

Referring to FIG. 4, the delay-locked loop 400 includes a measure delay array 405, a measure circuit 410, and a forward delay array 415 that combine to form the measure controlled delay circuit 420. The external clock CLK is provided to a buffer circuit 425, which is in turn coupled to the forward delay array 415. The buffer circuit 425 represents the input circuitry of the memory 100 (see FIG. 1) and may include one or more buffers and/or other logic circuitry.

A multiplexer 430 is coupled to receive inputs from the buffer 425 and the forward delay array 415. The multiplexer 430 is controlled during a measurement initialization cycle to bypass the forward delay array 415 until the timing signals have propagated through the delay-locked loop 400 and the measure controlled delay circuit 420 can be locked, as will be described in greater detail below. Following the measurement initialization cycle, the multiplexer 430 is controlled to select the output of the forward delay array 415 as its input.

The output of the multiplexer 430 is provided to a buffer circuit 435, and the buffer circuit 435 is in turn coupled to another buffer circuit 440. The buffer circuit 440 represents the output circuitry (i.e., output drivers, slew rate control devices, etc.) of the memory 100 (see FIG. 1) and may include one or more buffers and/or other logic circuitry. The output of the buffer circuit 440 represents the output clock signal DIIClk used by the memory 100.

A phase detector 445 is coupled to the buffer 425 for receiving a reference clock signal ClkRef and to a model delay circuit 450 for receiving a feedback clock signal ClkFb. The phase detector 445 measures a phase difference between the ClkRef signal provided by the buffer circuit 425 and the ClkFb signal exiting the model delay circuit 450. The phase detector 445 controls the amount of delay imposed by the forward delay array 415 responsive to the measured phase difference.

The model delay circuit 450 models the delay introduced into the external clock CLK by the buffer circuit 425 (d1) and the output circuitry of the memory 100 (d3) (e.g., the buffer circuit 440) to generate the feedback clock signal ClkFb. The modeled delays are referenced as d1' and d3' to correspond to the actual delays d1 and d3, respectively. The output of the buffer 435 is provided to the model delay circuit 450. Because the output of the buffer circuit 433 is fed to the model delay circuit 450, its delay (d2) need not be modeled by the model delay circuit 450. The output of the phase detector 435 is provided to the forward delay array 415 for controlling the synchronization after the completion of the measurement initialization cycle.

The feedback clock signal ClkFb generated by the model delay circuit 450 is coupled to provide a clock signal to a first clock divider 464. The first clock divider 464 receives the undivided clock ClkFb as input and provides a divided clock as output. As can be seen in FIG. 4, first clock divider 464 provides output including a first signal line labelled as ClkFbDiv and a second output line labelled as ClkFbDivF. The first clock divider 464 drives these two signal lines based on the ClkFb signal such that ClkFbDiv and ClkFbDivF each has period that is twice that of the ClkFb. One output signal, such as ClkFbDiv, is in phase with the ClkFb. The other output signal, ClkFbDivF is the inverse of ClkFbDiv. ClkFbDiv and ClkFbDivF may be coupled to a measurement trigger 465 that generates a feedback clock enable signal MsDyClk, which is provided as input to a delay array 420 to start a measurement of a forward delay (N*tCK−(d2+d1'+d3')).

The reference clock signal ClkRef generated by the buffer 425 is coupled to provide a clock signal to a second clock divider 454. The second clock divider 454 receives the undivided clock ClkRef as input and provides a divided clock as output. As can be seen in FIG. 4, second clock divider 454 provides output including a first signal line labelled as ClkRefDiv and a second output line labelled as ClkRefDivF. The second clock divider 454 drives these two signal lines based on the ClkRef signal such that ClkRefDiv and ClkRefDivF each has period that is twice that of the ClkRef. One output signal, such as ClkRefDiv, is in phase with the ClkRef. The other output signal, ClkRefDivF, is the inverse of ClkRefDiv. ClkRefDiv and ClkRefDivF may be coupled to a start trigger 455 that generates a count start signal FbClkEn, which is provided as a start signal to a counter 460. ClkRefDiv and ClkRefDivF additionally provide clock inputs to the counter 460 at Clock and ClockF, respectively.

The MsDyClk signal is provided to a delay element 470. The delay element 470 provides a fixed minimum delay to allow the delay-lock loop 415 to operate over a wide range of conditions. The amount of delay provided by the delay element 470 may vary depending on the particular implementation. The delay element 470 is coupled to a synchronizer 475 that is clocked by the ClkRefDiv and/or ClkRefDivF signals to generate a measurement pulse signal MStrobe. The MStrobe signal is coupled to the counter 460 as a stop input. The MStrobe signal is also provided to the measure circuit 410 to trigger the synchronization of the input and output clock signals.

Following the discussion of the synchronizer 475, the operation of the delay-locked loop 400 will be described in greater detail.

Figure 5:
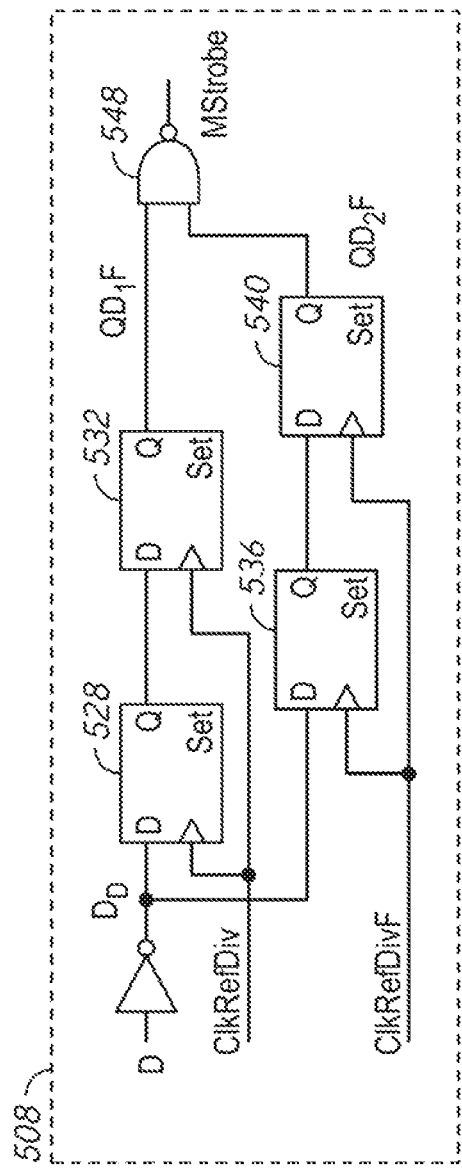
FIG. 5 is a schematic illustration of synchronizer circuits for the delay-locked loop of FIG. 4 according to an embodiment of the disclosure.

FIG. 5 is a circuit diagram that includes an example configuration for a synchronizer 508. The synchronizer 508 may correspond to the synchronizer 475 of FIG. 4. The synchronizer 508 includes two chains of series-connected flip-flops. The synchronizer 508 includes a chain of two upper flip-flops 528, 532 connected in series and a chain of two lower flip-flops 536, 540 connected in series. ClkRefDiv is coupled to the synchronizer 508 and provides a clock input for the upper flip-flops 528, 532. ClkRefDivF is coupled to the synchronizer 508 and provides a clock input for the lower flip-flops 536, 540.

The synchronizer 508 is configured to provide the MStrobe signal as output. The synchronizer 508 provides the output signal via a NAND gate that is coupled to the two sets of series connected flip-flops of the synchronizer. The synchronizer 508 includes NAND gate 548 that receives an output signal $Q_{D1F}$ from the first upper flip-flop 532 as a first input. An output signal $Q_{D2F}$ from the second lower flip-flop 540 provides the second input to the NAND gate 548. The MStrobe signal is provided as output from the NAND gate 548 of the synchronizer 508.

Figure 6:
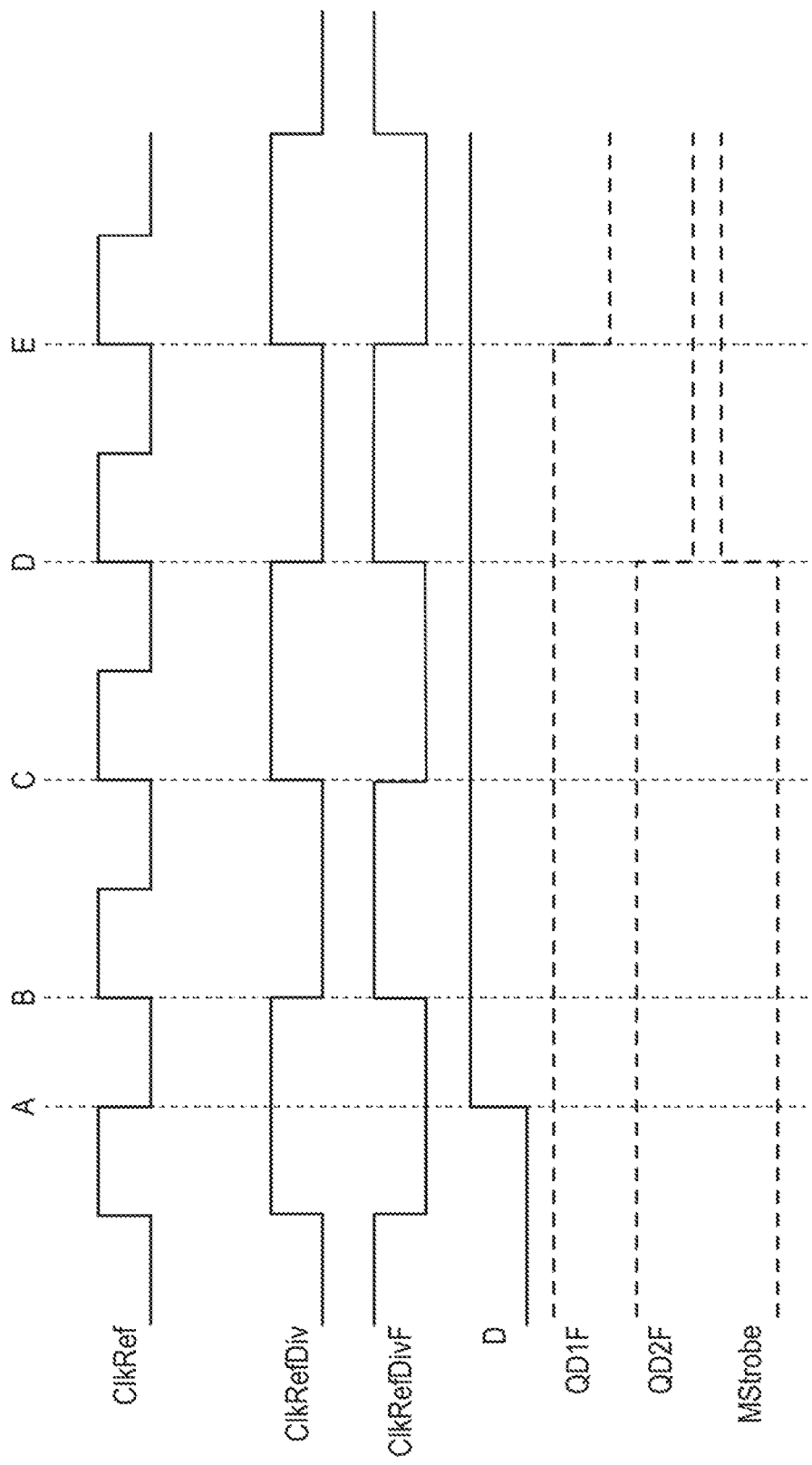
FIG. 6 is a timing diagram for various signals during operation of the synchronizer of FIG. 5 according to an embodiment of the disclosure.

The synchronizer 508 is configured to provide a clock edge on their outputs that is delayed three clock cycles with respect to an undivided clock signal. FIG. 6 is a timing diagram that provides an illustration of the synchronizer behavior with reference to the signals of the synchronizer 508 by way example and not limitation. FIG. 6 includes signal traces for ClkRefDiv and ClkRefDivF, which as can be seen, are 180 degrees out of phase. FIG. 6 also includes a signal trace for the undivided clock ClkRef. As can be seen, ClkRefDiv and ClkRefDivF have twice the period in comparison to that of ClkRef. FIG. 6 includes signal traces for D the synchronizer triggering signal, $Q_{D1F}$ the output of the upper flip-flop chain, $Q_{D2F}$ the output of the lower flip-flop chain, and MStrobe the output of the synchronizer 508.

Once the D signal is asserted, the D signal will propagate through both the upper flip-flops 528, 532 and the lower flip-flop 536, 540. The upper flip-flop 528, 532 are clocked on the rising edge of ClkRefDiv. The lower flip-flops 536, 540 are clocked on the rising edge of ClkRefDivF. Because these clock signals are 180 degrees out of phase, the D signal will emerge at the ends of the flip-flop chains at different times. For example, if the rising edge of the D signal occurs between the falling edge and the rising edge of ClkRefDiv, the D signal will emerge from the upper flip-flops 528, 532 before the D signal emerges from the lower flip-flops 536, 540. In contrast, if the rising edge of the D signal occurs between the falling edge and the rising edge of ClkRefDivF, the D signal will emerge from the lower flip-flop 536, 540 before the D signal emerges from the upper flip-flops 528, 532.

The latter example, where the D signal emerges first from the lower flip-flop 536, 540, is illustrated in FIG. 6. Here, the rising edge of the D signal occurs at time point A. The first rising clock edge after time point A occurs in ClkRefDivF at point B. Thus, at time point B, the D signal begins to propagate through the lower flip-flop chain as the first flip flop 536 is clocked by ClkRefDivF. The D signal does not being propagating through the upper flip-flop chain until the first flip flop 528 is clocked by ClkRefDiv at time point C. The second lower flip-flop 540 is clocked by ClkRefDivF at time point D, at which point $Q_{D2F}$ is asserted by way of a falling edge. $Q_{D1F}$ is asserted at a later time (time point E) when the second upper 532 flip-flop is clocked by ClkRefDiv. MStrobe is driven by a NAND gate 548 having $Q_{D1F}$ and $Q_{D2F}$ as inputs. Thus, a rising edge on MStrobe will occur on either a falling edge of $Q_{D1F}$ or a falling edge of $Q_{D2F}$. In the example of FIG. 6, a falling edge on $Q_{D2F}$ occurs first at point D. Thus, this point also corresponds to the rising edge of MStrobe.

As can be seen from FIG. 6, three clock cycles of the undivided clock ClkRef occur between the rising edge of the D signal and the rising edge of MStrobe. The number of flip-flops used in the synchronizer 508 may vary depending on the particular implementation resulting in different timings as measured by the undivided clock ClkRef. In the illustrated embodiment, three clock cycles of the undivided clock are used to allow the feedback path to be populated with clock signals and stabilize prior to synchronizing the clock signals.

Referring again to FIG. 4, the operation of the delay-locked loop 400 is now described in greater detail. Prior to synchronization, the multiplexer 430 is controlled to bypass the forward delay array 415. Hence, the feedback clock signal, ClkFb, is simply the reference clock signal, ClkRef, after it passes through the multiplexer 430, the buffer 435, and the model delay circuit 450. When the clock signal begins to transition, the ClkRef signal, now divided as ClkRefDiv and ClkRefDivF, clocks the data flip-flops of the start trigger 455. At a later point in time, the ClkRef signal propagates through the feedback path and the rising edges are seen in the ClkFb signal, which clocks the flip flops of the measurement trigger 465 as the divided clocks ClkFbDiv and ClkFbDivF.

Following the three clock cycles of the undivided clock that occur as described above via the operation of the start trigger 455, 508, the FbClkEn signal is asserted, and the counter 460 begins counting each pulse on the ClkRefDiv and ClkRefDivF signals. The ClkFbDiv and ClkFbDivF signals clock the flip-flops of the measurement trigger 465, and after three pulses of the undivided clock, the MsDyClk signal is asserted, which clocks the measure delay array 405. The MsDyClk signal generated by the measurement trigger 465 propagates through the measure delay array 405 until the measure circuit 410 is triggered. The measure circuit 410 includes a series of latches (not shown) that are triggered by the MStrobe signal. The particular latches triggered are those that correspond to the position of the pulse in the measure delay array 405.

Subsequently, the MsDyClk signal passes through the delay element 470 and is latched in the synchronizer 475 following the next rising edge of the ClkRef signal, thus generating the MStrobe signal. The MStrobe signal stops the counter 460 and latches the measure circuit:410, thereby configuring the forward delay array 415 to synchronize the CLK and DIIClk signals. The START and STOP signals provided to the counter 460 are synchronized with rising edges of the ClkRefDiv and ClkRefDivF signals. The value of the counter 460, LoopCount, represents the number of clock signals required for the reference clock signal to propagate through the feedback path.

After the forward delay array 415 is configured, the multiplexer 430 is configured to select the forward delay array 415 as its input. The output of the forward delay array 415 then passes through the buffer 435 and the model delay circuit 450 and becomes the source for the feedback clock signal, ClkFb, provided to the phase detector 445. The phase detector 445 subsequently controls the forward delay array 415 to maintain the synchronization of the CLK and DIIClk signals. The ClkFb signal is synchronized with the ClkRef signal with a multiple clock cycle difference, N*tCK. The LoopCount output of the counter 460 represents the value of N. Generally, a higher frequency clock signal results in a larger value for N.

Figure 7:
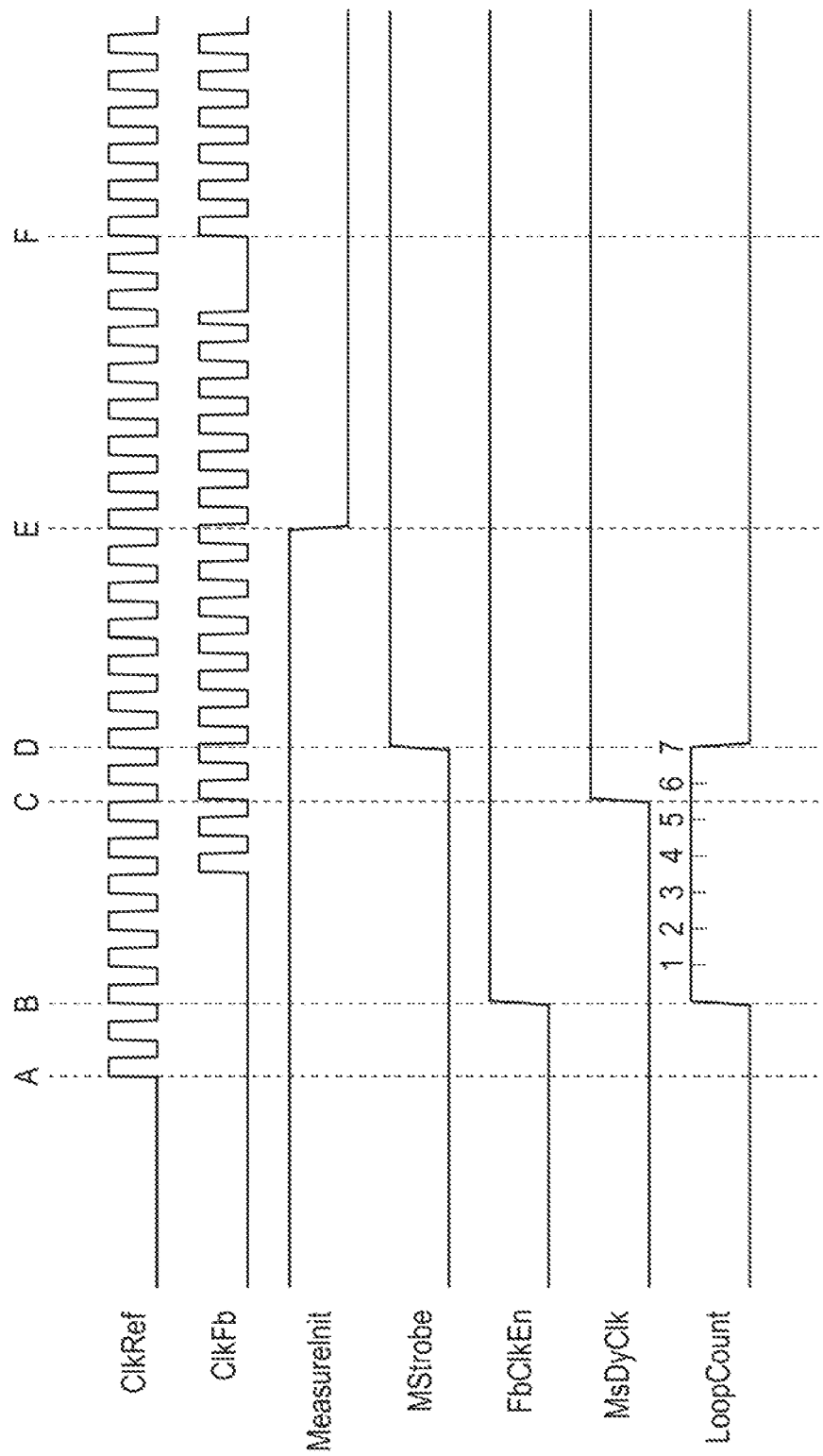
FIG. 7 is a timing diagram for various signals during operation of the delay-locked loop of FIG. 4 according to an embodiment of the disclosure.

Turning now to FIG. 7, a tuning diagram illustrating the operation of the delay-locked loop 400 is provided. The reference clock, ClkRef, and corresponding feedback clock, ClkFb, are illustrated. A MeasureInit signal represents the mode of the measure circuit 410. The measure controlled delay circuit 420 is operated during the measure initialization mode, and the delay-locked loop is operated otherwise. The measurement strobe, MStrobe, feedback clock enable, FbClkEn, and measurement delay clock, MsDyClk signals are also illustrated. A counter signal is provided to illustrate the time period that the counter 460 is enabled. The counter signal is not an actual signal employed in the delay-locked loop 400, but rather is a composite of the FbClkEn and MStrobe signals that start and stop the counter 460.

At time point A, the reference clock signal begins transitioning. The delay-locked loop 400 operates in measurement initialization mode, so the MeasureInit signal is asserted and the multiplexer 430 is configured to bypass the forward delay array 415. At time point B, the flip-flops of the start trigger 455 latch either ClkRefDiv or ClkRefDivF on a third cycle of the undivided clock ClkRef, thus asserting the FbClkEn signal and starting the counter 460. At time point C, the third cycle of the ClkFb signal is latched by the measurement trigger 465 indicating that the reference clock has propagated the feedback path and causing the assertion of the MsDyClk signal. The MsDyClk signal pulses the measure delay array 405.

At time point D, the MsDyClk signal, as delayed by the delay element 470 is latched in the flip-flop 475 causing the assertion of the MStrobe signal. The MStrobe signal activates the measure circuit 410 to determine the position of the previous MsDyClk pulse in the measure delay array 405 and stop the counter 460. The delay in the forward delay array 415 is set by the position latched in the forward delay array 415 to synchronize the reference and feedback clock signals.

At time point F, the MeasureInit signal is deasserted and the multiplexer 430 is configured to use the signal passing through the forward delay array 415 for the output clock signal, DIIClk. At time point F, the signal passing through the forward delay array 415 to the buffer 435 propagates through the feedback path to the model delay circuit 450 to become the ClkFb signal. The ClkRef and ClkFb signals are provided to the phase detector 445 for subsequent synchronization control. Subsequent changes in the relative phases of the ClkRef and ClkFb signals will cause the phase detector 445 to adjust the delay provided by the forward delay array 415 to maintain synchronization.

The LoopCount value determined by the counter 460 represents the value of N, which identifies the number of clock cycles that the output clock is offset from the input clock. The LoopCount value has various uses. For example, LoopCount value is useful for establishing read latency in a memory device. An exemplary device employing the Loop-Count is described in U.S. Pat. No. 6,687,185, entitled "METHOD AND APPARATUS FOR SETTING AND COMPENSATING READ LATENCY IN A HIGH SPEED DRAM," assigned to the assignees of the present application, and incorporated herein by reference in its entirety.

Figure 8:
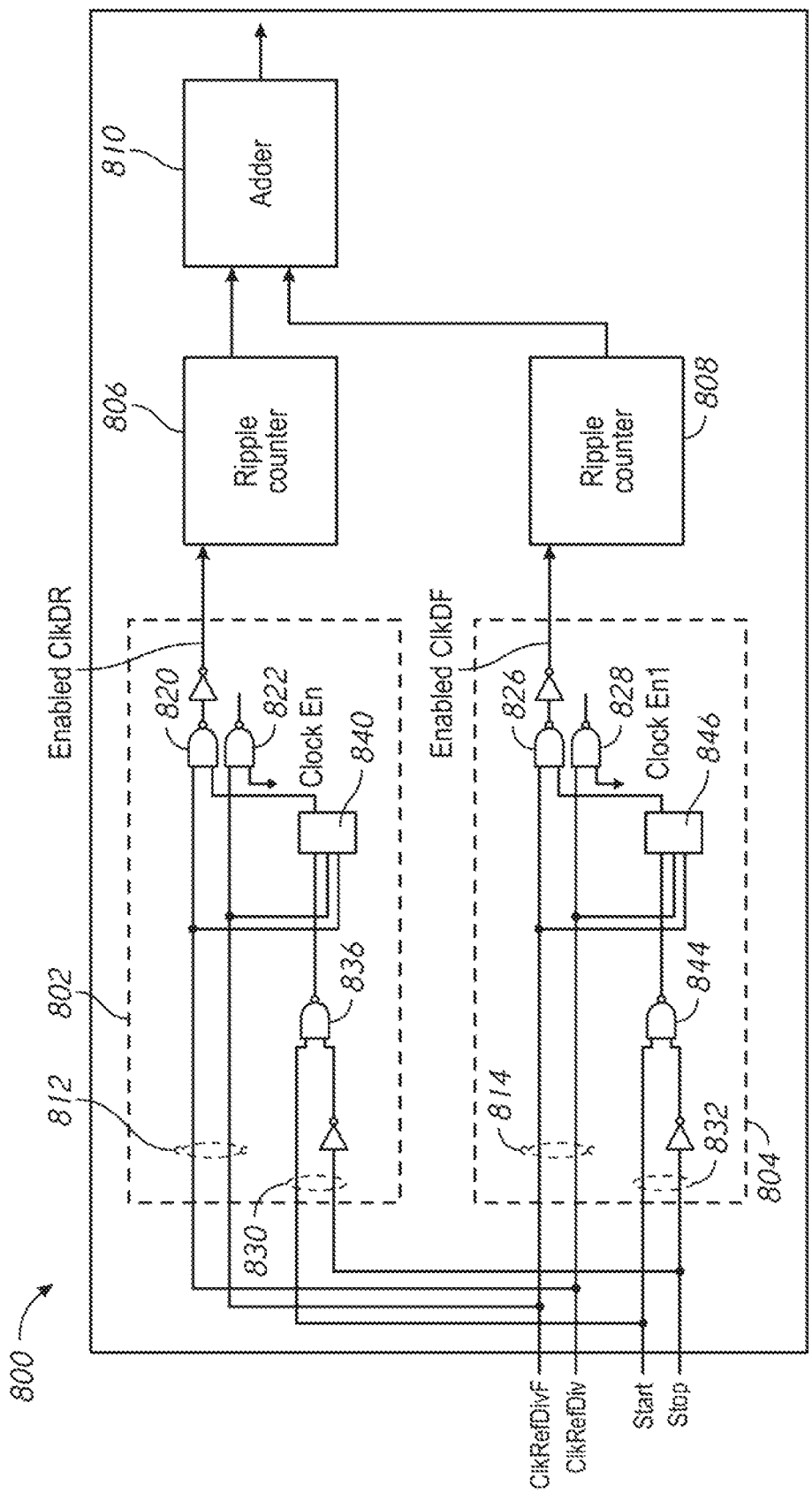
FIG. 8 is a schematic illustration of a loop counter for the delay-locked loop of FIG. 4 according to an embodiment of the disclosure.

FIG. 8 is a circuit diagram for a loop counter 800 in accordance with the present disclosure. The loop counter 800 may correspond to the loop counter 460 of FIG. 4. The loop counter 800 is generally configured to count the number of clock cycles N that occur during an initialization of a delay-locked loop (shown in FIG. 1-4). The loop counter 800 includes an upper N-detect block 802 and a lower N-detect block 804. Each N-detect block 802, 804 is configured for a partial count of the total number of clock cycles N. In this regard, each N-detect block is coupled to a ripple counter, each of which is coupled to an adder. More specifically, the upper N-detect block 802 is coupled to an upper ripple counter 806. The lower N-detect block 804 is coupled to a lower ripple counter 808. The upper ripple counter 806 and the lower ripple counter 808 are each coupled to an adder 810 that provides the loop counter 800 output.

The loop counter 800 includes a plurality of signal pathways through which inputs received at the loop counter 800 propagate. The loop counter 800 includes an upper clock pathway 812 and a lower clock pathway 814. The upper clock pathway 812 propagates ClkRefDiv and ClkRefDivF through the upper N-detect block 802. Similarly, the lower clock pathway 814 propagates ClkRefDiv and ClkRefDivF through the lower N-detect block 804. The upper clock pathway 812 couples to upper and lower NAND gates 820, 822. Similarly, the lower clock pathway 814 couples to upper and lower NAND gates 826, 828. In each clock pathway, the upper NAND gates 820, 826 are configured to pass an output signal to a corresponding ripple counter 806, 808. The lower NAND gates 822, 828 are configured to provide signal termination without further signal propagation.

The arrangement of ClkRefDiv and ClkRefDivF in the first clock pathway 812 is opposite to that of the second clock pathway 814. Thus, in the upper clock pathway 812, ClkRefDiv couples to the upper NAND gate 820 to generate the upper ripple counter 806 input. Here, ClkRefDivF couples to the lower NAND gate 822 and is terminated. In the lower clock pathway 814, ClkRefDivF couples to the upper NAND gate 826 to generate the lower ripple counter 808 input. Here, ClkRefDiv couples to the lower NAND gate 828 and is terminated. This arrangement of ClkRefDiv and ClkRefDivF facilitates counting of different clock cycles by the ripple counters 806, 808. As described in greater detail below, the number of clock cycles counted by the ripple counters 806, 808 may be added together to get the total number of clock cycles that occur during an initialization of the delay-locked loop.

The loop counter 800 additionally includes an upper enable pathway 830 and a lower enable pathway 832. The upper enable pathway 830 propagates START and STOP signals through the upper N-detect block 802. Similarly, the lower enable pathway 832 propagates the START and STOP signals through the lower N-detect block 804. As shown in FIG. 4, the START signal corresponds to the FbClkEn signal that is provided as output from the start trigger 455. The STOP signal corresponds to the MStrobe signal that is provided as output from the synchronizer 475. The upper enable pathway 830 couples to a NAND gate 836 that provides a single output to a flip-flop 840. Similarly, the lower enable pathway 832 couples to a NAND gate 844 that provides a single output to a flip-flop 846.

The flip-flops 840, 846 provide a coupling between the clock pathways 812, 814 and the enable pathways 830, 832 in a way that facilitates each N-detect block 802, 804 in its function of clock counting. Here, the flip-flops 840, 846 include two additional inputs from the clock signal pathways 802, 804. The flip-flops 840, 846 in this arrangement are configured to provide enable signals to the upper NAND gates 820, 826 that are located at downstream points in the N-detect blocks 802, 804. The flip-flop 840 of the upper N-detect block 802 generates an output that in FIG. 8 is labelled as ClockEn. The flip-flop 846 of the lower N-detect block 804 generates an output that in FIG. 8 is labelled as ClockEn1.

The output of the first N-detect block 802 couples to the upper ripple counter 806. The upper N-detect block 802 asserts its output when it counts a clock cycle. This output causes the upper ripple counter 806 to count the number of signal assertions generated by the upper N-detect block 802. The lower ripple counter 808 functions in a similar manner to count the number of signal assertions generated by the lower N-detect block 804. The adder 810 sums the inputs from the ripple counters 806, 808 to produce a total count value at the output of the counter 800.

Figure 9:
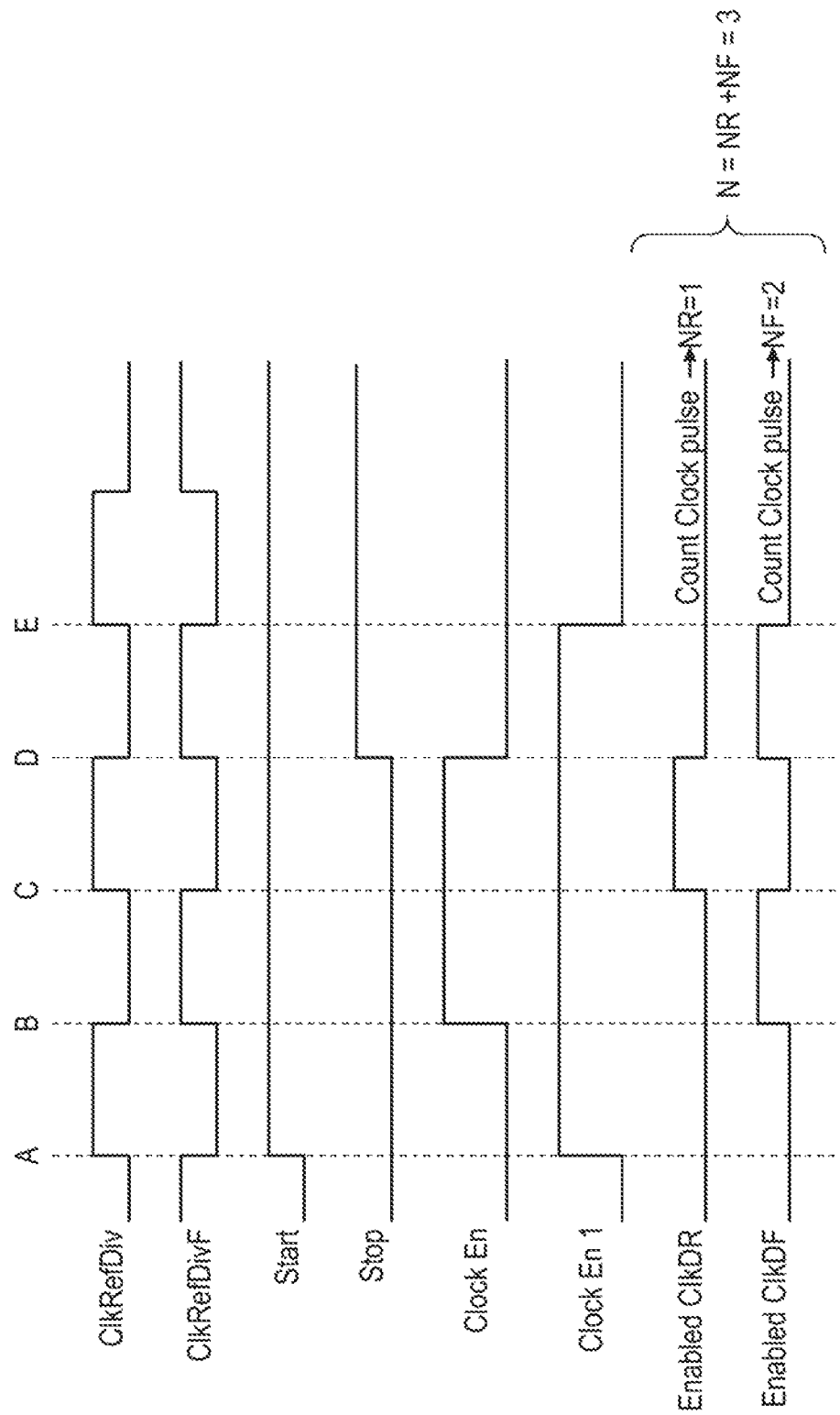
FIG. 9 is a timing diagram for various signals during operation of the loop counter embodiment of FIG. 7 according to an embodiment of the disclosure.

FIG. 9 is a timing diagram that provides an illustration of the loop counter behavior with reference to the loop counter 800 of FIG. 8 by way of example and not limitation. FIG. 9 includes signal traces for ClkRefDiv and ClkRefDivF, which as can be seen, are 180 degrees out of phase. FIG. 9 also includes signal traces for the START and STOP signal. A rising edge of the START signal corresponds to the beginning of the measure initialization cycle, as indicated by the FbClkEn signal. A rising edge of the STOP signal corresponds to the end of the measure initialization cycle, as indicated by the MStrobe signal. FIG. 9 also includes signal traces for the ClockEn and ClockEn1 signals. A rising edge of the ClockEn signal corresponds to the upper N-detect block 802 being enabled, as indicated by the output of the flip-flop 840. A rising edge of the ClockEn1 corresponds to the lower N-detect block 804 being enabled, as indicated by the output of the flip-flop 846. FIG. 9 also includes signal traces for Enabled ClkDR and EnabledClkDF signals. Enabled ClkDR corresponds to the output of the upper N-detect block 802. EnabledClkDF corresponds to the output of the lower N-detect block 804.

The START and STOP signal define a time period during which the counter 800 counts clock cycles. In operation, the counter 800 counts clock cycles between the rising edge of the START signal and the rising edge of the STOP signal. During this time period, the upper N-detect block 802 and the lower N-detect block 804 are enabled by ClockEn and ClockEn1, respectively. ClockEn goes high when both the counter 800 is in operation, as indicated by the START and STOP signals, and a rising edge occurs on the ClkRefDivF signal. Similarly, ClockEn1 goes high when both the counter 800 is in operation, as indicated by the START and STOP signals, and a rising edge occurs on the ClkRefDiv signal.

ClockEn enables the upper N-detect block 802 to count clock signals of ClkRefDiv. Similarly, ClockEn1 enables the lower N-detect block 804 to count clock signals of ClkRefDivF. The upper N-detect block 802 counts a clock cycle on the rising edge ClkRefDiv when the upper N-detect block 802 is enabled as indicated by the ClockEn signal. Similarly, the lower N-detect block counts a clock cycle on the rising edge ClkRefDivF when the lower N-detect block 804 is enabled as indicated by the ClockEn1 signal. Enabled ClkDR and Enabled ClkDF are the resulting output that occurs from the upper N-detect block 802 and the lower N-detect block 804.

In the example of FIG. 9, operation of the counter 800 begins at time point A with a rising edge of the START signal. The rising edge of the START signal corresponds to beginning of a measure initialization cycle. A rising edge of the ClkRefDiv signal also occurs at time point A. The combination of the counter 800 being in operation and the rising edge of the ClkRefDiv signal results in the lower N-detect block 804 being enabled, as indicated by the rising edge of ClockEn1 at time point A.

At time point B, a rising edge of ClkRefDivF occurs. The combination of the counter 800 being in operation and the rising edge of the ClkRefDivF signal results in the upper N-detect block 802 being enabled, as indicated by the rising edge of ClockEn at time point B. Also, at time point B, the combination of the lower N-detect block 804 being enabled as indicated by the ClockEn1 signal and the rising edge of ClkRefDivF signal results in the lower N-detect block 804 counting a clock cycle. This counting is indicated by the rising edge of the Enabled ClkDF signal.

At time point C, a rising edge of ClkRefDiv occurs. At time point C, the combination of the upper N-detect block 802 being enabled as indicated by the ClockEn signed and the rising edge of ClkRefDiv signal results in the upper N-detect block 802 counting a clock cycle. This counting is indicated by the rising edge of the Enabled ClkDR signal.

At time point D, a rising edge of ClkRefDivF occurs. At time point D, the combination of the lower N-detect block 804 being enabled as indicated by the ClockEn1 signal and the rising edge of ClkRefDivF signal results in the lower N-detect block 804 counting a clock cycle. This counting is indicated by the rising edge of the Enabled ClkDF signal. A rising edge of the STOP signal also occurs at point D. The rising edge of the STOP signal corresponds to the end of the measure initialization cycle. This rising edge causes the counter 460 to cease operation. With the counter 460 operation suspended, clock cycle counting does not continue past point D. This behavior can be seen at point E where a rising edge of ClkRefDiv occurs, but no clock cycle counting occurs on the Enabled ClkDR line.

The Enabled ClkDR and Enabled ClkDF signals correspond to the output of the upper N-detect block 802 and the lower N-detect block 804, respectively. As described above, the output signal drive the ripple counters 806, 808, which store a count of the clock cycles as venerated by the N-detect blocks 802, 804. Output from the ripple counters is received at the adder 810, which adds the two count values together and outputs the resulting value of N on the CLK signal line. With the value of N known through the operation of the loop counter 800, N may then be used in accordance with the various uses described herein. For instance, a memory may use N to make further timing adjustments in the form of adjusting timing amounts through shifters or the like that are associated with components that are downstream from the delay-locked loop. A phase detector may also employ the N value to ensure that any changes applied to the delay of the forward delay array are propagated through the feedback path and are reflected in a feedback signal prior to making another phase comparison.

For example, the loop counter 800 can calculate the N (=tFP/tCK) value using divide clock. tFP is a forward path delay and tCK is a clock frequency. According to FIG. 8, the loop counter 800 counts rising pulse and falling pulse of divide clock respectively by using two ripple counters. The loop counter 800 sums the values obtained by the respective ripple counters. This method can increase settling time (Ts) by using the divide clocks, resulting in enlarging MTBF (mean time between failure) value.

The above specification, examples and data provide a complete description of the structure and use of exemplary embodiments of the disclosure as defined in the claims. Although various embodiments have been described above with a certain degree of particularity, or with reference to one or more individual embodiments, those skilled in the art could make numerous alterations to the disclosed embodiments without departing from the spirit or scope of the disclosure. Other embodiments are therefore contemplated. It is intended that all matter contained in the above description and shown in the accompanying drawings shall be interpreted as illustrative only of particular embodiments and not limiting. Changes in detail or structure may be made without departing from the basic elements defined in the following claims.

The foregoing description has broad application. The discussion of any embodiment is meant only to be explanatory and is not intended to suggest that the scope of the disclosure, including the claims, is limited to these examples. In other words, while illustrative embodiments of the disclosure have been described in detail herein, the inventive concepts may be otherwise variously embodied and employed, and the appended claims are intended to be construed to include such variations, except as limited by the prior art.

The invention claimed is:

1. An apparatus comprising:
   a delay-locked loop configured to synchronize clock signals internal to a memory with an externally received clock signal;
   a measure controlled delay circuit configured to initialize the delay-locked loop by traversing the delay-locked loop with a reference clock to determine a variable delay amount; and
   a loop counter coupled to a divided clock portion of the measure controlled delay circuit, the loop counter having a first section configured to count clock cycles on a first divided clock signal and a second section configured to count clock cycles on a second divided clock signal.

2. The apparatus as claimed in claim 1, wherein the first section of the loop counter is configured to count the first divided clock signal during a first enabled period that is produced responsive to the first divided clock signal.

3. The apparatus as claimed in claim 2, wherein the second section of the loop counter is configured to count the second divided clock signal during a second enabled period that is produced responsive to the second divided clock signal.

4. The apparatus as claimed in claim 1, wherein the first section of the loop counter includes a first detection block coupled to a first ripple counter.

5. The apparatus as claimed in claim 4, wherein the second section of the loop counter includes a second detection block coupled to a second ripple counter.

6. The apparatus as claimed in claim 5, wherein the first and second detection blocks are enabled by start and stop signals that indicate, respectively, the beginning and end of traversing the delay-locked loop.

7. The apparatus as claimed in claim 5, wherein the loop counter includes an adder coupled to the first and second ripple counters and configured to output a value N corresponding to the number of clock cycles for the reference clock to traverse the delays locked loop.

8. The apparatus as claimed in claim 7, further comprising:
   a delay path configured to receive the clock signal and propagate the clock signal, and change a delay value thereof responsive to the value N.

9. An apparatus comprising:
   a delay-locked loop configured to synchronize an output clock signal with an input clock signal;
   a first clock divider circuit configured to divide a reference clock signal into multiple portions, the reference clock signal based on the input clock signal;
   a second clock divider circuit configured to divide a feedback signal, wherein the output clock signal is based on the feedback signal;
   a synchronizer circuit configured to provide a measurement pulse signal based on the divided feedback signal and the divided reference clock signal; and a loop counter circuit configured to start a count based on the divided reference clock signal and stop the count based on the measurement pulse signal, the loop counter circuit comprising an adder configured to sum counts of each portion of the divided reference clock signal.

10. The apparatus of claim 9, further comprising a variable delay component configured to delay command signals of a memory based on the count provided by the loop counter circuit.

11. The apparatus of claim 9, further comprising a measure control delay circuit configured to apply an amount of delay to the reference clock signal.

12. The apparatus of claim 11, further comprising a multiplexer configured to provide the reference clock signal as the feedback clock signal for a first number of cycles of the input clock signal after initialization and then provide the delayed input clock signal provided by the measure control delay circuit.

13. The apparatus of claim 11, further comprising a phase detector circuit configured to measure a difference between the feedback clock signal and the reference clock signal, wherein the delay of the measure control delay circuit has a delay is based, in part on the difference measured by the phase detector circuit.

14. The apparatus of claim 9, wherein the loop counter circuit comprises a first clock pathway configured to count a first portion of the divided reference clock signal and a second clock pathway configured to count a second portion of the divided reference clock signal.

15. A method comprising:
synchronizing clock signals internal to a memory with an externally received clock signal with a delay-locked loop;
initializing the delay-locked loop with a measure controlled delay circuit by traversing the delay-locked loop with a reference clock to determine the variable delay amount; and
dividing the reference clock into multiple portions; and
counting each of the multiple portions of the reference clock with a different section of a loop counter.

16. The method of claim 15, further comprising adding the count of each of the multiple portions of the reference clock to determine a value N corresponding to the number of clock cycles for the reference clock to traverse the delay-locked loop.

17. The method of claim 16, further comprising adjusting the value of a delay time in a delay path, wherein the delay path receives the clock signal and propagates the clock signal after the delay time.

18. The method of claim 15, further comprising starting the counting based on the reference clock and stopping the counting based on a feedback clock which has traversed the delay-locked loop and the reference clock.

19. The method of claim 15, wherein counting each of the multiple portions of the reference clock comprises propagating each of the multiple portions along a respective one of a plurality of clock pathways to a respective one of a plurality of ripple counters.

20. The method of claim 15, wherein counting each of the multiple portion of the reference clock comprises counting each of the multiple portions during a respective enabled period.

* * * * *